United States Patent
Asakura

[19]

[11] Patent Number: 5,966,045
[45] Date of Patent: *Oct. 12, 1999

[54] SEMICONDUCTOR DEVICE HAVING A FIRST STAGE INPUT UNIT TO WHICH A POTENTIAL IS SUPPLIED FROM EXTERNAL AND INTERNAL POWER SUPPLIES

[75] Inventor: Mikio Asakura, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/624,828

[22] Filed: Mar. 27, 1996

[30] Foreign Application Priority Data

Apr. 21, 1995 [JP] Japan .................... 7-096685

[51] Int. Cl.⁶ ..................................... G05F 1/10
[52] U.S. Cl. .......................... 327/544; 327/540; 365/226; 365/227
[58] Field of Search ................... 327/538, 540, 327/543, 544; 365/226, 227

[56] References Cited

U.S. PATENT DOCUMENTS

| | | |
|---|---|---|
| 5,046,052 | 9/1991 | Miyaji et al. ............... 365/226 |
| 5,132,555 | 7/1992 | Takahashi ............... 307/296.1 |
| 5,363,333 | 11/1994 | Tsujimoto ............... 327/538 |
| 5,452,256 | 9/1995 | Ichikawa ............... 365/226 |
| 5,544,102 | 8/1996 | Tobita et al. ............ 365/189.09 |
| 5,568,440 | 10/1996 | Tsukude et al. ............ 365/222 |
| 5,592,423 | 1/1997 | Tokami ............... 365/221 |

FOREIGN PATENT DOCUMENTS

| | | |
|---|---|---|
| 3-214669 | 9/1991 | Japan . |
| 5-189967 | 7/1993 | Japan . |

*Primary Examiner*—Timothy P. Callahan
*Assistant Examiner*—Jung Ho Kim
*Attorney, Agent, or Firm*—McDermott, Will & Emery

[57] ABSTRACT

A power supply for supplying a power supply potential to a first stage input buffer circuit of a semiconductor device is changed according to the types of first stage input circuits. For example, an external power supply potential is supplied without change in a value from an external power supply to a first stage input buffer circuit to which a signal which activates a circuit provided in the subsequent stage only by transition from an "H" level to an "L" level such as an $\overline{RAS}$ signal. Thus, reduction in power consumption can be achieved. A stable internal power supply potential obtained by down-converting an external power supply potential is supplied from an internal power supply to a first stage input circuit to which a signal which activates a circuit provided in the subsequent stage by any one of transitions from an "L" level to an "H" level and from an "H" level to an "L" level. Thus, output information can be stabilized.

14 Claims, 5 Drawing Sheets

SEMICONDUCTOR DEVICE HAVING A FIRST STAGE INPUT UNIT TO WHICH A POTENTIAL IS SUPPLIED FROM EXTERNAL AND INTERNAL POWER SUPPLIES

BACKGROUND OF THE INVENTION

1. Field of the Invention

The present invention relates to a semiconductor device having an internal voltage down-converting power supply, and more particularly, to a first stage input circuit (first stage input unit) of a DRAM (Dynamic Random Access Memory).

2. Description of the Background Art

A conventional semiconductor device which operates with a single external power supply is disclosed, for example, in Japanese Patent Laying-Open No. 5-189967. A semiconductor device shown herein by way of example is a DRAM.

FIG. 6 is a schematic block diagram partially showing a conventional DRAM. FIG. 6 also shows a power supply system of the DRAM.

Referring to FIG. 6, a portion of the conventional DRAM includes a voltage down-converting circuit (with small capacity) 2, a voltage down-converting circuit (with large capacity) 3, a last stage data output buffer circuit 4, an input buffer circuit 6, a peripheral circuit 8, and a memory cell array 7. Input buffer circuit 6 includes an input buffer circuit 5a provided in the first stage (hereinafter referred to as first stage input buffer circuit) and an input buffer circuit 5b provided in the subsequent stage (hereinafter referred to as subsequent stage input buffer circuit). Peripheral circuit 8 includes an internal control signal generating circuit 8a and a peripheral circuit (another peripheral circuit) 8b other than the internal control signal generating circuit.

An external power supply 1 supplies an external power supply potential (Vcc). Voltage down-converting circuit (with small capacity) 2 has relatively poor ability to supply current. Voltage down-converting circuit (with small capacity) 2 produce a down-converted potential from the external power supply potential Vcc, and supplies it as an internal power supply potential. Voltage down-converting circuit (with small capacity) 2 is steadily in an operative state.

Voltage down-converting circuit (with large capacity) 3 has relatively superior ability to supply current. Voltage down-converting circuit (with large capacity) 3 produces a down-converted potential from the external power supply potential Vcc and supplies it as an internal power supply potential, when the DRAM is in a selected state, that is, when an internal $\overline{\text{RAS}}$ (Row Address Strobe) signal is at an "L" level. Last stage data output buffer circuit 4 is a circuit provided in the last stage of a data output buffer circuit for externally outputting data.

First stage input buffer circuit 5a consists of a control signal input buffer, a data input signal input buffer, an X (row) address signal input buffer, and a Y (column) address signal input buffer. A control signal is an $\overline{\text{RAS}}$ signal, a $\overline{\text{CAS}}$ (Column Address Strobe) signal, a $\overline{\text{WE}}$ (Write Enable) signal, an $\overline{\text{OE}}$ (Output Enable) signal or the like.

The external power supply potential Vcc is supplied from external power supply 1 to first stage input buffer circuit 5a. An internal power supply potential is supplied from voltage down-converting circuit (with small capacity) 2 to subsequent stage input buffer circuit 5b during standby. An internal power supply potential is supplied from voltage down-converting circuit (with large capacity) 3 to subsequent input buffer circuit 5b during operation.

An internal power supply potential is supplied from voltage down-converting circuit (with small capacity) 2 to memory cell array 7 during standby. An internal power supply potential is supplied from voltage down-converting circuit (with large capacity) 3 to memory cell array 7 during operation.

Furthermore, an internal power supply potential is supplied from voltage down-converting circuit (with small capacity) 2 to peripheral circuit 8 during standby. An internal power supply potential is supplied from voltage down-converting circuit (with large capacity) 3 to peripheral circuit 8 during operation.

In the conventional DRAM (semiconductor device) described above, only the external power supply potential Vcc is supplied to first stage input buffer circuit 5a for receiving a control signal, a data input signal, an X address signal and a Y address signal (these signals are hereinafter collectively referred to as "an external signal" in some cases). As opposed to this, there is also a DRAM, as another example of the conventional DRAM, in which only an internal power supply potential is supplied to a first stage input buffer circuit (corresponding to first stage input buffer circuit 5a in FIG. 6).

As described above, only one of an internal power supply potential and an external power supply potential Vcc has been generally used as a potential supplied to first stage input buffer circuit 5a in the conventional semiconductor technique. In other words, a single power supply potential from a single power supply has been supplied to first stage input buffer circuit 5a.

In general, about 10% variation in the external power supply potential Vcc supplied from external power supply 1 with respect to a prescribed potential is tolerated according to the specifications. For example, in the case of a DRAM (semiconductor device) having an external power supply of a 5 V system, variation from 4.5 V to 5.5 V in an external power supply potential Vcc is permitted. Therefore, even if the external power supply potential Vcc is an unstable potential which varies in the range from 4.5 V to 5.5 V, first stage input buffer circuit 5a is ideally required to output completely the same potential information. Furthermore, in a logic circuit (for example, an inverter, an NOR gate, and an NAND gate), a threshold of an input signal for determining whether the input signal is at an "L" level or an "H" level is constant regardless of a value of the external power supply potential Vcc. For example, in the case of a general-purpose standard DRAM, a threshold for determining whether an "L" level or an "H" level is standardized so as to be in the range from 0.8 V to 2.4 V. It is noted that the logic circuit is generally used as first stage input buffer circuit 5a.

FIG. 7 is a schematic block diagram showing a conventional DRAM.

Referring to FIG. 7, the conventional DRAM includes a DQ pin 100, control signal pins 101, 102, 103 and 104, an address pin 105, a data input buffer circuit 16a, a data output buffer circuit 16b, an $\overline{\text{RAS}}$ buffer circuit 15a, a $\overline{\text{CAS}}$ buffer circuit 15b, a $\overline{\text{WE}}$ buffer circuit 15c, an $\overline{\text{OE}}$ buffer circuit 15d, a Y address buffer circuit 19, an X address buffer circuit 20, a voltage down-converting circuit (with small capacity) 2, a voltage down-converting circuit (with large capacity) 3, another peripheral circuit 8b, an internal control signal generating circuit 18, a Y address decoder 21, a sense amplifier 23, an X address decoder 22, and a memory cell array 17. It is noted that a portion similar to that in FIG. 6 is denoted by the same reference and description thereof will not be repeated.

Data input buffer circuit 16a, $\overline{\text{RAS}}$ buffer circuit 15a, $\overline{\text{CAS}}$ buffer circuit 15b, $\overline{\text{WE}}$ buffer circuit 15c, $\overline{\text{OE}}$ buffer circuit 15d, Y address buffer circuit 19 and X address buffer circuit 20 correspond to input buffer circuit 6 shown in FIG. 6. Internal control signal generating circuit 18 is a part of internal control signal generating circuit 8a shown in FIG. 6.

A data input/output (I/O) signal 9 is a signal including data to be input externally or data to be output externally. A signal to be input externally included in data I/O signal 9 is called a data input signal. A signal to be output externally included in data I/O signal 9 is called a data output signal. Data input buffer circuit 16a receives data input signal 9 and inputs data to memory cell array 17. Data output buffer 16b receives data from memory cell array 17 and outputs data output signal 9.

$\overline{\text{RAS}}$ buffer circuit 15a is an input buffer circuit to which an $\overline{\text{RAS}}$ signal 10 for controlling introduction of a row (X) address is input. $\overline{\text{RAS}}$ buffer circuit 15a outputs an internal $\overline{\text{RAS}}$ signal to internal control signal generating circuit 18, based on the $\overline{\text{RAS}}$ signal 10.

$\overline{\text{CAS}}$ buffer circuit 15b is an input buffer circuit to which a $\overline{\text{CAS}}$ signal 11 for controlling introduction of a column (Y) address is input. $\overline{\text{CAS}}$ buffer circuit 15b outputs an internal $\overline{\text{CAS}}$ signal to internal control signal generating circuit 18, based on the $\overline{\text{CAS}}$ signal 11.

$\overline{\text{WE}}$ buffer circuit 15c is an input buffer circuit to which a $\overline{\text{WE}}$ signal 12 for controlling read/write operation is input. $\overline{\text{WE}}$ buffer circuit 15c outputs an internal $\overline{\text{WE}}$ signal to internal control signal generating circuit 18, based on the $\overline{\text{WE}}$ signal 12.

$\overline{\text{OE}}$ buffer circuit 15d is an input buffer circuit to which an $\overline{\text{OE}}$ signal 13 for controlling output of data is input. $\overline{\text{OE}}$ buffer circuit 15d outputs an internal $\overline{\text{OE}}$ signal to internal control signal generating circuit 18, based on the $\overline{\text{OE}}$ signal 13. It is noted that $\overline{\text{RAS}}$ signal 10, $\overline{\text{CAS}}$ signal 11, $\overline{\text{WE}}$ signal 12 and $\overline{\text{OE}}$ signal 13 are hereinafter collectively referred to as a control signal in some cases.

Internal control signal generating circuit 18 outputs an internal control signal 4, based on the internal $\overline{\text{RAS}}$ signal, the internal $\overline{\text{CAS}}$ signal, the internal $\overline{\text{WE}}$ signal or the internal $\overline{\text{OE}}$ signal.

Address pin 105 receives an address signal 14 including an X (row) address signal and a Y (column) address signal for designating an address. Y address buffer circuit 19 receives as an input a Y address signal YL of address signal 14 and outputs a signal based on the Y address signal YL to Y address decoder 21. X address buffer 20 receives as an input an X address signal XL of address signal 14 and outputs a signal based on the X address signal XL to X address decoder 22.

Sense amplifier 23 senses information held in a memory cell located at designated coordinates. The information read by sense amplifier 23 is output through data output buffer circuit 16b to DQ pin 100 for inputting/outputting data.

Memory cell array 17 includes a plurality of memory cells for storing information. Memory cell array 17 is similar to memory cell array 7 shown in FIG. 6. $\overline{\text{RAS}}$ signal 10, $\overline{\text{CAS}}$ signal 11, $\overline{\text{WE}}$ signal 12 and $\overline{\text{OE}}$ signal 13 are control signals in a sense that they control internal operation of the DRAM. Furthermore, data input signal 9, control signals 10–13 and address signal 14 are external signals in a sense that they are input externally.

In this DRAM, all the control signals ($\overline{\text{RAS}}$ signal 10, $\overline{\text{CAS}}$ signal 11, $\overline{\text{WE}}$ signal 12 and $\overline{\text{OE}}$ signal 13) out of the above described external signals (address signal 14 for controlling designation of coordinates in memory cell array 17, data input signal 9, $\overline{\text{RAS}}$ signal 10, $\overline{\text{CAS}}$ signal 11, $\overline{\text{WE}}$ signal 12 and $\overline{\text{OE}}$ signal 13) activate chip operation according to each control signal by transition from an "H" level to an "L" level.

Address signal 14 and data input signal 9 activate subsequent stage input buffer circuit 5b (FIG. 6) by any one of transitions from an "H" level to an "L" level and from an "L" level to an "H" level. In addition, first stage input buffer circuit 5a (FIG. 6) must receive a signal during operation of subsequent stage input buffer circuit 5b, peripheral circuit 8 (FIG. 6) and the like within the DRAM.

Thus, first stage input buffer circuit 5a will be subject to variation in a power supply potential which is caused by such internal operation. Accordingly, first stage input buffer circuit 5a which is required to receive a signal during internal operation need operate more stably in a wider range of variation in a power supply potential than the range of variation in an external power supply potential according to the specifications, compared to subsequent stage input buffer circuit 5a which is not required to receive a signal during internal operation.

As described above, only external power supply 1 or only an internal power supply is used as a power supply of first stage input buffer circuit 5a. Problems caused in the case where a potential is supplied only from external power supply 1 as a power supply potential of first stage input buffer circuit 5a as shown in FIG. 6 will now be described.

First stage input buffer circuit 5a to which address signal 14 and data input signal 9 are input is subject to the specification-tolerated range of variation in the external power supply potential Vcc supplied from external power supply 1. Furthermore, first stage input buffer circuit 5a for receiving address signal 14 and data input signal 9 must receive a signal (address signal 14 and data input signal 9) during operation of subsequent stage input buffer circuit 5b in input buffer circuit 6, peripheral circuit 8 and the like.

As can be seen from the above description, first stage input buffer circuit 5a for receiving address signal 14 and data input signal 9 has many factors causing circuit operation and output information thereof to be unstable. Accordingly, it has been difficult to achieve stable operation of first stage input buffer circuit 5a which is required to receive a signal (address signal 14 and data input signal 9) during internal operation.

Problems caused in the case where a potential is supplied only from an internal power supply as a power supply potential of first stage input buffer circuit 5a will now be described. As to the voltage down-converting circuits for generating an internal power supply potential, only a voltage down-converting circuit with relatively small capacity is generally caused to operate during standby period when the ability to supply a power supply potential may be poor as shown in FIG. 6, so that current consumption is suppressed by this voltage down-converting circuit.

In a first stage input buffer circuit (corresponding to first stage input buffer circuit 5a of FIG. 6), however, an input signal is permitted to be at an intermediate level such as 2.4 V and 0.8 V. Therefore, through current flows in the first stage input buffer circuit due to the input signal at an intermediate level such as 2.4 V and 0.8 V. In other words, through current is permitted to flow in the first stage input buffer circuit to some degree.

Accordingly, leak current due to this through current must be supplemented, and ability to supply a power supply potential, which is superior to ability to supply a power supply potential which is required to maintain supply of an internal power supply potential necessary for the first stage input buffer circuit in the absence of leak current, must be provided in a voltage down-converting circuit with small capacity. Therefore, sufficient reduction in power consumption of a voltage down-converting circuit with small capacity has not been achieved, resulting in increase in current consumption during standby.

In view of the above description, in the conventional semiconductor device (DRAM), that is, in the case where a power supply potential is supplied directly from external power supply 1 to first stage input buffer circuit 5a for receiving address signal 14, data input signal 9 and control signals 10–13, influence of variation in the external power supply potential Vcc supplied from external power supply 1 on subsequent stage input buffer circuit 5b has been required to be suppressed.

In addition, in the conventional semiconductor device (DRAM), that is, in the case where only an internal power supply potential produced from the external power supply potential Vcc is supplied as a power supply potential to first stage input buffer circuit 5a for receiving address signal 14, data input signal 9 and control signals 10–13, suppression of power consumption for causing an internal down-converted potential generating circuit (voltage down-converting circuit) for producing an internal power supply potential to operate has not been achieved during standby.

SUMMARY OF THE INVENTION

The present invention is made to solve such problems as described above, and it is an object of the present invention to provide a semiconductor device capable of stabilizing output information of a first stage input buffer circuit and realizing reduction in power consumption.

A semiconductor device in accordance with the present invention includes an input unit (hereinafter referred to as a first stage input unit) which is provided in the first stage and to which a plurality of external signals are input. This first stage input unit includes at least two different input circuits of first and second type (hereinafter referred to as first and second type first stage input circuits) to which external signals are directly input, that is, which are provided in the first stage. An external power supply potential is supplied from an external power supply located outside the semiconductor device to the first type first stage input circuit. An internal power supply potential is supplied from an internal power supply provided inside the semiconductor device to the second type first stage input circuit.

As described above, the semiconductor device in accordance with the present invention is provided with the first type first stage input circuit and the second type first stage input circuit. Accordingly, the first type first stage input circuit can be used for an external signal for controlling internal operation of the semiconductor device. In this case, since an external power supply potential rather than an internal power supply potential is supplied to the first type first stage input circuit, an internal power supply potential need not be generated for the first type first stage input circuit, so that consumption of driving current for an internal power supply (for example, a voltage down-converting circuit) can be suppressed. Furthermore, the second type first stage input circuit can be used for an external signal required during operation of the semiconductor device. In this case, since a stable internal power supply potential rather than an external power supply potential having large variation is supplied to the second type first stage input circuit, the second type first stage input circuit can operate stably even during operation of the semiconductor device.

Thus, the semiconductor device in accordance with the present invention can achieve reduction in power consumption during standby and improvement in stability of operation thereof.

Preferably, an external signal input to the first type first stage input circuit is a control signal for controlling internal operation of the semiconductor device. More specifically, the control signal is a row address strobe signal, a column address strobe signal, a write enable signal, an output enable signal or the like. Furthermore, an external signal input to the second type first stage input circuit is an address signal or a data input signal. In other words, the address signal and the data input signal are signals to be input during operation of the semiconductor device.

When the semiconductor device is in a standby state, an output level of the second type first stage input circuit is fixed according to an internal control signal which is based on a control signal.

As described above, the first type first stage input circuit can be used for a control signal. In this case, since an external power supply potential rather than an internal power supply potential is supplied to the first type first stage input circuit, an internal power supply potential need not be generated for the first type first stage input circuit, so that consumption of driving current for an internal power supply (for example, a voltage down-converting circuit) can be suppressed. Furthermore, the second type first stage input circuit can be used for an address signal or a data input signal. In this case, since a stable internal power supply potential rather than an external power supply potential having large variation is supplied to the second type first stage input circuit, the second type first stage input circuit can operate stably. Furthermore, since an output level of the second type first stage input circuit is fixed, that is, the second type first stage input circuit is deactivated during standby by an internal control signal which is based on a control signal, consumption of driving current for an internal power supply (for example, a voltage down-converting circuit) for generating an internal power supply potential to be supplied to the second type first stage input circuit can be suppressed.

Thus, the semiconductor device in accordance with the present invention can achieve reduction in power consumption and improvement in stability of operation thereof.

More preferably, the first type first stage input circuit has an NOR gate structure. More specifically, the first type first stage input circuit having an NOR gate structure is used for a control signal which is rendered active by transition from an "H" level to an "L" level. Furthermore, the second type first stage input circuit has an NAND gate structure. More specifically, the second type first stage input circuit having an NAND gate structure is used for an address signal or a data input signal which is rendered active by any one of transitions from an "H" level to an "L" level and from an "L" level to an "H" level.

Since the second type first stage input circuit having an NAND gate structure can be used for an address signal or a data input signal which is rendered active by any one of transitions from an "H" level to an "L" level and from an "L" level to an "H" level as described above, reduction in area of the second type first stage input circuit and higher operation speed thereof can be achieved compared to the case where a second type first stage input circuit having an NOR gate structure is used.

Thus, the semiconductor device in accordance with the present invention can achieve high speed operation speed and reduction in area.

Preferably, the first stage input unit includes a plurality of first type first stage input circuits. All of the plurality of first type first stage input circuits are constituted by the same logic circuit. The first stage input unit further includes a plurality of second type first stage input circuits. All of the plurality of second type first stage input circuits are constituted by the same logic circuit.

As described above, all of the plurality of first type first stage input circuits are made to have the same logic circuit structure, that is, all of the plurality of first type first stage input circuits to which a plurality of external signals (control signals) having the same property are respectively input are made to have the same logic circuit structure, whereby response of all of the first type first stage input circuits can be made to be the same. In addition, all of the plurality of second type first stage input circuits are made to have the same logic circuit structure, that is, the plurality of second type first stage input circuits to which a plurality of external signals having the same property are respectively input are made to have the same logic circuit structure, response of all of the second type first stage input circuits can be made to be the same.

Thus, the semiconductor device in accordance with the present invention enables constant operation speed of the first type first stage input circuit and the second type first stage input circuit, and stabilization of operation of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A DRAM as a semiconductor device in accordance with the present invention will now be described in conjunction with the accompanying drawings.

[First Embodiment]

Figure 1:
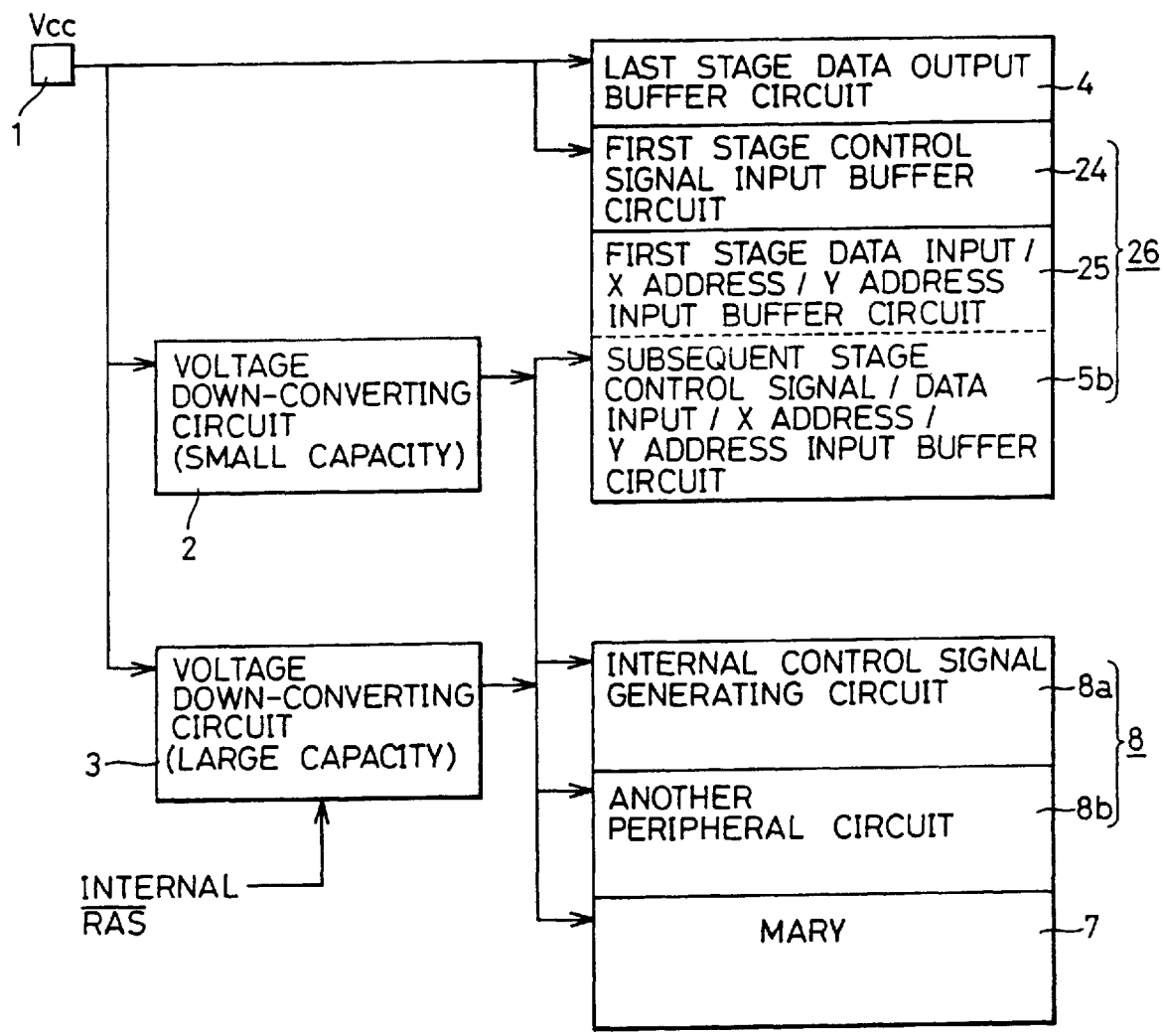
FIG. 1 is a schematic block diagram partially showing a DRAM in accordance with a first embodiment of the present invention.
Figure 6:
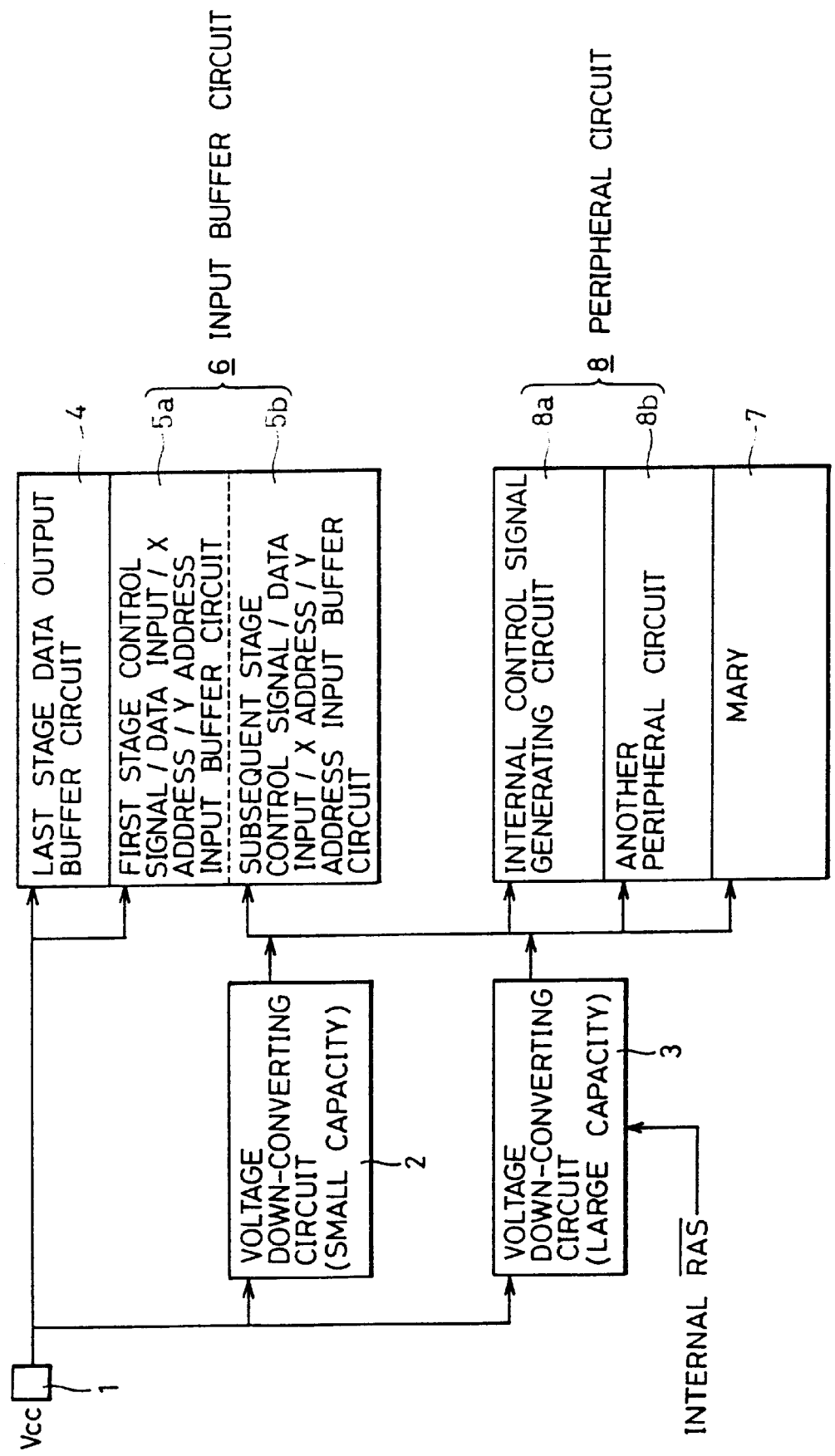
FIG. 6 is a schematic block diagram partially showing a conventional DRAM.

FIG. 1 is a schematic block diagram partially showing a DRAM in accordance with a first embodiment of the present invention. FIG. 1 also shows a power supply system of the DRAM in accordance with the first embodiment of the present invention. It is noted that a portion similar to that of FIG. 6 is denoted by the same reference in the figure and description thereof will not be repeated. The whole structure of the DRAM in accordance with the present embodiment is similar to that of FIG. 7. External signals (a control signal, a data input signal, and an address signal) are also similar to those in Description of Background Art.

The DRAM of FIG. 1 is different from that of FIG. 6 in an input buffer circuit. Therefore, differences between the DRAMs of FIGS. 1 and 6 will be primarily described as to FIG. 1.

Referring to FIG. 1, an input buffer circuit 26 includes a first stage input buffer circuits 24 and first stage input buffer circuits 25 which are provided in the first stage, and subsequent stage input buffer circuits 5b which are provided in the subsequent stage. First stage input buffer circuits 24 and 25 constitute a first stage input unit. First stage input buffer circuits 24 respectively receive control signals for controlling internal operation of the DRAM, such as an $\overline{RAS}$ signal, a $\overline{CAS}$ signal, a $\overline{WE}$ signal, an $\overline{OE}$ signal and the like. In other words, first stage input buffer circuits 24 respectively receive control signals which are rendered active by only one transition (particular transition) out of transitions from an "H" level to an "L" level and from an "L" level to an "H" level. First stage input buffer circuits 25 respectively receives external signals other than such control signals which are rendered active by only one transition (particular transition) as received by first stage input buffer circuits 24. More specifically, the external signals are a data input signal and an address signal.

In the power supply system shown in FIG. 1, a voltage down-converting circuit 2 with small capacity and a voltage down-converting circuit 3 with large capacity are used as in the case of the conventional DRAM. More specifically, two voltage down-converting circuits having different capacities (abilities) are used in FIG. 1. However, a common voltage down-converting circuit, that is, a single voltage down-converting circuit may be used to supply a potential. If the DRAM has a circuit which requires a potential at a level different from that of those voltage down-converting circuits, more than two voltage down-converting circuits may be provided.

As shown in FIG. 1, an external power supply 1 is used as a power supply for first stage input buffer circuits 24 to which control signals which are rendered active by transition from an "H" level to an "L" level (that is, which is rendered active by only one transition) are respectively input. More specifically, an external power supply potential Vcc is supplied directly from external power supply 1 to first stage input buffer circuits 24. In this case, the control signals which are rendered active by transition from an "H" level to an "L" level is such a signal as an $\overline{RAS}$ signal, a $\overline{CAS}$ signal, a $\overline{WE}$ signal, an $\overline{OE}$ signal and the like for controlling internal operation of the DRAM, as described above.

During standby of the DRAM, first stage input buffer circuit 25 are deactivated by internal control signals of an MOS (Metal Oxide Semiconductor) level produced from these control signals, respectively. A down-converted potential (hereinafter referred to as "internal power supply potential") produced by down-converting an external power supply potential Vcc from external power supply 1 is supplied to first stage input buffer circuits 25 to which not the external power supply potential Vcc is directly supplied but a data input signal, a Y address signal and an X address signal are respectively input. This internal potential is produced by down-converting an external power supply potential from external power supply 1 by voltage down-converting circuit 2 or voltage down-converting circuit 3.

As described above, in the DRAM in accordance with the first embodiment, a power supply potential to be supplied to all the first stage input buffer circuits is not supplied from a power supply for generating a potential at a single level, as opposed to the conventional DRAM.

Figure 2:
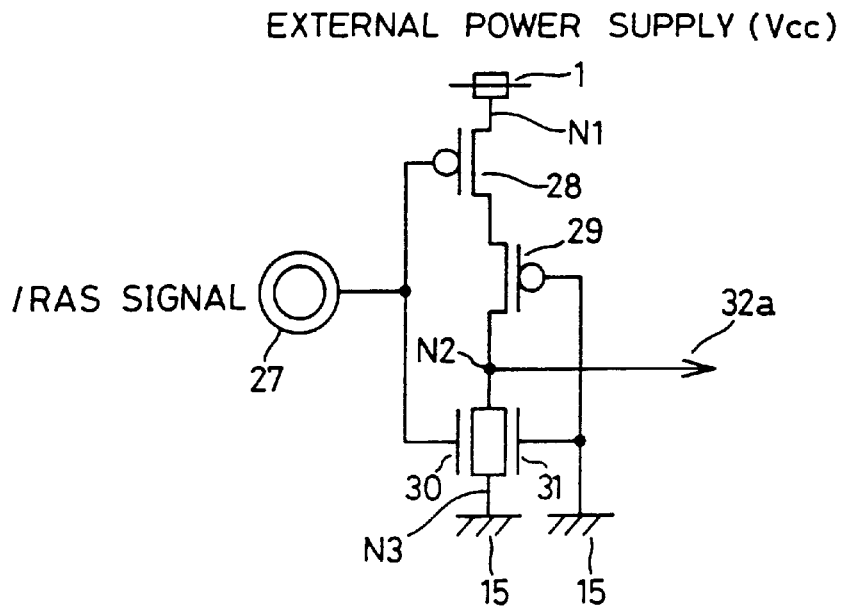
FIG. 2 is a circuit diagram showing in detail a first stage input buffer circuit to which a control signal is input in the DRAM in accordance with the first embodiment of the present invention.

FIG. 2 is a circuit diagram showing in detail first stage input buffer circuit 24 (FIG. 1) to which a control signal is input. The first stage input buffer circuit for receiving a control signal in FIG. 2 is shown as an example of a first stage input buffer circuit to which an $\overline{RAS}$ signal which is one of external signals is input. Referring to FIG. 2, the first stage input buffer circuit for receiving a control signal includes P channel MOSFETs (Metal Oxide Semiconductor Field Effect Transistors) 28 and 29, and N channel MOSFETs 30 and 31.

P channel MOSFETs 28 and 29 are connected in series between a node N1 having an external power supply potential Vcc supplied from an external power supply 1 and an output node N2 outputting an output signal. N channel MOSFETs 30 and 31 are connected in parallel between output node N2 and a node N3 having a ground potential supplied from a ground 15.

An $\overline{RAS}$ signal 27 is input to the gates of P channel MOSFET 28 and N channel MOSFET 30. The ground potential is input from ground 15 to the gates of P channel MOSFET 29 and N channel MOSFET 31. In addition, an output signal (output information) 32a is input to subsequent stage input buffer circuit 5b (FIG. 1) for an $\overline{RAS}$ signal 27. It is noted that an $\overline{RAS}$ signal 27 is similar to an $\overline{RAS}$ signal 10 in FIG. 7. External power supply 1 corresponds to external power supply 1 of FIG. 1.

P channel MOSFET 29 is always on, and N channel MOSFET 31 are always off.

Accordingly, if an $\overline{RAS}$ signal 27 at an "H" level is input, P channel MOSFET 28 is turned off, while N channel MOSFET 30 is turned on. Thus, an output signal 32a at an "H" level is output from output node N2.

If an $\overline{RAS}$ signal 27 at an "L" level is input, P channel MOSFET 28 is turned on, while N channel MOSFET 30 is turned off. Thus, an output signal 32a at an "H" level is output from output node N2. It is noted that the DRAM is caused to be in an operative state when an $\overline{RAS}$ signal 27 is at an "L" level. The first stage input buffer circuit to which an $\overline{RAS}$ signal is input has a circuit structure similar to that of a first stage input buffer circuit to which another control signal is input. It is noted that the first stage input buffer circuit of FIG. 2 has an NOR gate structure which receives an $\overline{RAS}$ signal 27 and the ground potential.

Figure 3:
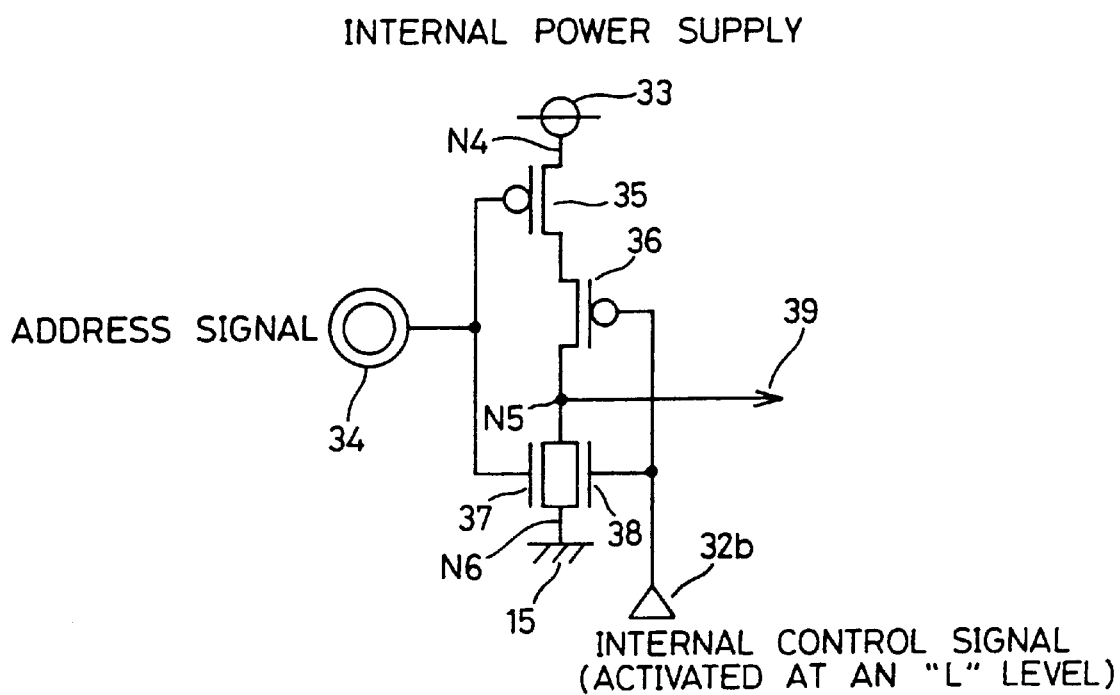
FIG. 3 is a circuit diagram showing in detail a first stage input buffer circuit to which a data input signal or an address signal is input in the DRAM in accordance with the first embodiment of the present invention.

FIG. 3 is a circuit diagram showing in detail first stage input buffer circuit 25 to which a data input signal or an address signal is input. FIG. 3 shows a first stage input buffer circuit to which an X (row) address signal is input.

Referring to FIG. 3, the first stage input buffer circuit to which an address signal is input includes P channel MOSFETs 35 and 36, and N channel MOSFETs 37 and 38.

P channel MOSFETs 36 and 37 are connected in series between a node N4 having an internal power supply potential from an internal power supply 33 and an output node N5.

An output signal 39 of the first stage input buffer circuit is output from output node N5. N channel MOSFETs 37 and 38 are connected in parallel between output node N5 and a node N6 having a ground potential supplied from ground 15.

An X (row) address signal 34 is input to the gates of P channel MOSFET 35 and N channel MOSFET 37. An internal control signal 32b is input to the gates of P channel MOSFET 36 and N channel MOSFET 38. It is noted that the first stage input buffer circuit of FIG. 3 has an NOR gate structure which receives as inputs an X (row) address signal 34 and an internal control signal 32b.

An internal control signal 32b is a signal in response to an $\overline{RAS}$ signal. More specifically, an internal control signal 32 is a signal which is produced by the first stage input buffer circuit (FIG. 2) to which an $\overline{RAS}$ signal is input, and which transitions between the Vcc (external power supply potential) level and the Vss (ground potential) level. Transition between the Vcc level and the Vss level means that P channel MOSFET 36 and N channel MOSFET 38 can be turned on/off completely.

Operation when the DRAM is in an operative state will now be described. In this case, an $\overline{RAS}$ signal and an internal control signal 32b are at an "L" level. Therefore, P channel MOSFET 36 is on, and N channel MOSFET 38 is off. If an X (row) address signal 34 at an "H" level is input, P channel MOSFET 35 is turned off and N channel MOSFET 37 is turned on. Thus, an output signal 39 at an "L" level is output from output node N5.

If an X (row) address signal 34 at an "L" level is input, P channel MOSFET 35 is turned on and N channel MOSFET 37 is turned off. Thus, an output signal 39 at an "H" level is output from output node N5. An internal control signal 32b is rendered active at an "L" level, and activates the first stage input buffer circuit to which an X (row) address signal 34 is input. More specifically, if an $\overline{RAS}$ signal is at an "L" level and the DRAM is in an operative state, the first stage input buffer circuit to which an X (row) address signal 34 is input will be activated.

Operation when an $\overline{RAS}$ signal is at an "H" level and the DRAM is in a standby state will now be described. In this case, an internal control signal 32b is at an "H" level. Therefore, P channel MOSFET 36 is turned off, and N channel MOSFET 38 is turned on. Accordingly, an output signal 39 output from output node N5 is always at an "L" level. More specifically, if an $\overline{RAS}$ signal is at an "H" level and the DRAM is in a standby state, an internal control signal 32b is rendered inactive, and the first stage input buffer circuit to which an X (row) address signal 34 is input is deactivated.

As described above, an internal control signal 32b deactivates the first stage input buffer circuit to which an X (row) address signal 34 is input when the DRAM is in a standby state, so that through current flowing in the first stage input buffer circuit to which an X (row) address signal 34 is input is suppressed during standby of the DRAM.

It is noted that internal power supply 33 corresponds to voltage down-converting circuits 2 and 3 (FIG. 1), and supplies a potential (internal power supply potential) produced by down-conversion of an external power supply potential Vcc by voltage down-converting circuits 2 and 3. The first stage input buffer circuit to which an X (row) address signal is input has a circuit structure similar to circuit structures of the first stage input buffer circuits to which a Y (column) address signal and a data input signal are respectively input.

An example in which an N channel MOSFET and a P channel MOSFET having the same size (the same gate length L and the same gate width (channel width) W) are provided will now be considered. In this case, it is known that current flowing in a channel region of the N channel MOSFET is larger than that flowing in a channel region of the P channel MOSFET if a potential is supplied to the gate electrodes of the N channel MOSFET and the P channel MOSFET so that absolute values of gate-source potentials are equal to each other.

Therefore, because of such properties of the transistors of two types as described above, a threshold can be set small easily in the circuit having an NOR gate structure in which two P channel MOSFETs 28 and 29 are connected in series and two N channel MOSFETs 30 and 31 are connected in parallel as shown in FIG. 2. This is described in detail in the following.

Referring to FIG. 2, one input is always a ground potential, that is, a ground potential is always input to the gates of P channel MOSFET 29 and N channel MOSFET 31, and the first stage input buffer circuit of FIG. 2 functions as an inverter.

It is herein assumed that P channel MOSFETs 28 and 29 and N channel MOSFETs 30 and 31 have the same size.

In this case, supposing that P channel MOSFETs 28 and 29 and N channel MOSFETs 30 and 31 are resistances, a relationship between resistance of combination of P channel MOSFETs 28 and 29 and resistance of combination of N channel MOSFETs 30 and 31 will now be described.

Since P channel MOSFETs 28 and 29 are connected in series, resistance of combination of P channel MOSFETs 28 and 29 is proportional to a value of 2L/W.

Since N channel MOSFET 31 is always off, that is, since N channel MOSFET 31 can be ignored, resistance of combination of N channel MOSFETs 30 and 31 is proportional to a value of L/W.

In addition, it is generally said that ability of an N channel MOSFET is about twice that of a P channel MOSFET if respective values of L/W of N channel and P channel MOSFETs are the same. Accordingly, a threshold of the first stage input buffer circuit functioning as an inverter is smaller than half the external power supply potential Vcc from external power supply 1.

In such sense as described above, it can be said that a threshold can be set easily to low in the NOR gate in which P channel MOSFETs 28 and 29 are connected in series and N channel MOSFETs 30 and 31 are connected in parallel. As described above, it is said that ability of the N channel MOSFET is about twice that of the P channel MOSFET if respective values of L/W of N channel and P channel MOSFETs are the same. Therefore, if a threshold is to be half the external power supply potential Vcc from external power supply 1, respective gate widths Ws of P channel MOSFETs 28 and 29 must be four times what they are.

Thus, it is appropriate to use an NOR gate in a first stage input circuit which requires a threshold lower than half the external power supply potential Vcc supplied from external power supply 1. An example in which the external power supply potential Vcc supplied from external power supply 1 is 5 V and the minimum value of a high level and the maximum value of a low level of a signal to be input (an $\overline{RAS}$ signal in the case of FIG. 2) are respectively 2.4 V and 0.8 V will now be considered.

If the signal to be input is 2.4 V or more, it is considered to be at an "H(1)" level, and considered to be at an "L(0)" level if 0.8 V or less. More specifically, an example in which a TTL (Transistor Transistor Logic) is used is herein considered. If a threshold for determining whether an "H" level or an "L" level is to be set to a value smaller than half the external power supply potential Vcc, that is, to 1.6 V which is an intermediate level between 2.4 V and 0.8 V in the first stage input buffer circuit of FIG. 2 functioning as an inverter, it is desirable to use an NOR gate for the first stage input circuit as shown in FIG. 2.

It is noted that a threshold can be set small easily for the same reason as described above in the first stage input buffer circuit in which P channel MOSFETs 35 and 36 are connected in series and N channel MOSFETs 37 and 38 are connected to in parallel as shown in FIG. 3.

If a state of a potential of a control signal such as an $\overline{RAS}$ signal, a $\overline{CAS}$ signal or the like transitions from an "H" level to an "L" level, first stage input buffer circuit 24 (FIG. 1) outputs an output signal at an "H" level. Then, subsequent stage input buffer circuit 5b (FIG. 1) is activated.

As described above, a control signal such as an $\overline{RAS}$ signal activates subsequent stage input buffer circuit 5b by only particular transition (one transition out of "H" to "L" level transition and "L" to "H" level transition). Accordingly, only one transition out of two transitions needs to be considered in design of first stage input buffer circuit 24 to which a control signal such as an $\overline{RAS}$ signal is input. Therefore, design of first stage input buffer circuit 24 to which a control signal is input is easier than that of a first stage input buffer circuit which activates subsequent stage input buffer circuit 5b by any one of transitions of an input signal from an "H" level to an "L" level and from an "L" level to an "H" level. Consequently, external power supply 1 having larger variation in the external power supply potential Vcc can be used as a power supply for first stage input buffer circuit 24 to which a control signal such as an $\overline{RAS}$ signal is input.

On the other hand, first stage input buffer circuit 25 (FIG. 1) to which an external signal (a data input signal, an address signal) other than the control signal is input can activate subsequent stage input buffer circuit 5b by any one of transitions of a potential state of an input signal from an "H" level to an "L" level and from an "L" level to an "H" level. In addition, first stage input buffer circuit 25 to which an address signal or a data input signal is input is required to receive an address signal or a data input signal even during operation of a circuit other than first stage input buffer circuit 25.

Therefore, output information of first stage input buffer circuit 25 to which an address signal or a data input signal is input is likely to be unstable. Accordingly, an exact and stable power supply potential must be supplied to first stage input buffer circuit 25 to which a data input signal or an address signal (a Y address signal, an X address signal) is input.

Thus, a power supply potential having small variation is supplied to first stage input buffer circuit 25 to which an address signal or a data input signal is input, using internal power supply 33 (voltage down-converting circuits 2 and 3) as a power supply as shown in FIGS. 1 and 3, so that a potential state of an output signal 39 is stabilized.

An address signal and a data input signal are signals which need not be received until a control signal is rendered active. Accordingly, as shown in FIG. 3, the first stage input buffer circuit to which an address signal or a data input signal is input can be rendered inactive by an internal control signal 32b of the MOS level during standby of the DRAM. Thus, through current in the first stage input buffer circuit to which an address signal or a data input signal is input can be almost suppressed during standby of the DRAM.

As described above, in the DRAM in accordance with the first embodiment of the present invention, an external power supply potential Vcc is supplied from external power supply 1 to first stage input buffer circuits 24 to which control signals such as an $\overline{\text{RAS}}$ signal are respectively input, as shown in FIGS. 1 to 3. Furthermore, a stable internal power supply potential is supplied from internal power supply 33 (voltage down-converting circuits 2 and 3) to first stage input buffer circuits 25 to which signals other than the control signals, in particular, an address signal (a Y address signal and an X address signal) and a data input signal are respectively input. As described above, different power supply potentials are supplied to the first stage input buffer circuits of the DRAM in accordance with the first embodiment, depending on properties of signals to be input thereto. Thus, the following effects can be obtained by the DRAM of the first embodiment.

An external power supply potential Vcc is supplied directly from external power supply 1 to first stage input buffer circuits 24 to which control signals such as an $\overline{\text{RAS}}$ signal, a $\overline{\text{CAS}}$ signal, a $\overline{\text{WE}}$ signal and an $\overline{\text{OE}}$ signal are respectively input. Accordingly, through current flowing from the internal power supply to first stage input buffer circuits 24 can be eliminated during standby of the DRAM, resulting in reduction in power consumption during standby thereof. More specifically, since the internal power supply (voltage down-converting circuit) will not operate any more than necessary in order to supplement leak current caused by through current, power consumption during standby can be reduced. It is noted that leak current due to through current flowing from external power supply 1 into first stage input buffer circuits 24 to which control signals are respectively input is supplemented by external power supply 1.

Furthermore, since a stable internal power supply potential is supplied from internal power supply 33 (voltage down-converting circuits 2 and 3) to first stage input buffer circuits 25 to which an address signal and a data input signal are respectively input, stable potential information can be output to the subsequent stage. In addition, since first stage input buffer circuits 25 are deactivated by internal control signals 32b during standby, current consumption during standby can be reduced.

In the first embodiment, each of the first stage input buffer circuits is formed to have a logic circuit structure of an NOR gate by way of example, as shown in FIGS. 2 and 3. However, the present invention is not limited to the NOR gate so long as those circuits are buffer circuits.

[Second Embodiment]

Figure 7:
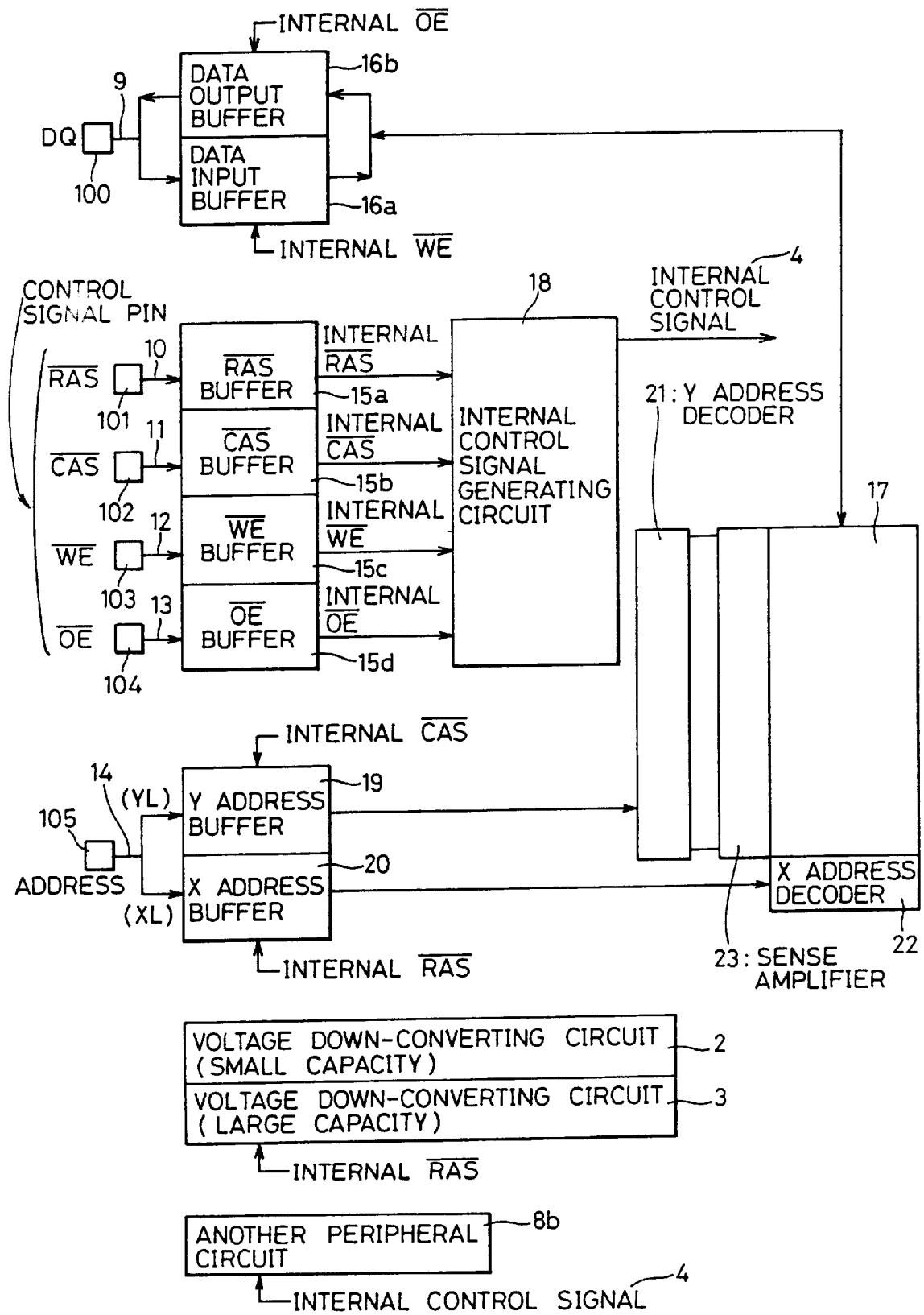
FIG. 7 is a schematic diagram showing a conventional DRAM.

The whole structure of a DRAM in accordance with a second embodiment of the present invention is similar to that of FIG. 7. A portion of the DRAM in accordance with the second embodiment is similar to a portion of the DRAM of FIG. 1. In addition, external signals (a control signal, a data input signal, and an address signal) are similar to those in the first embodiment. Accordingly, the DRAM of the second embodiment will now be described using FIGS. 1 and 7.

Figure 4:
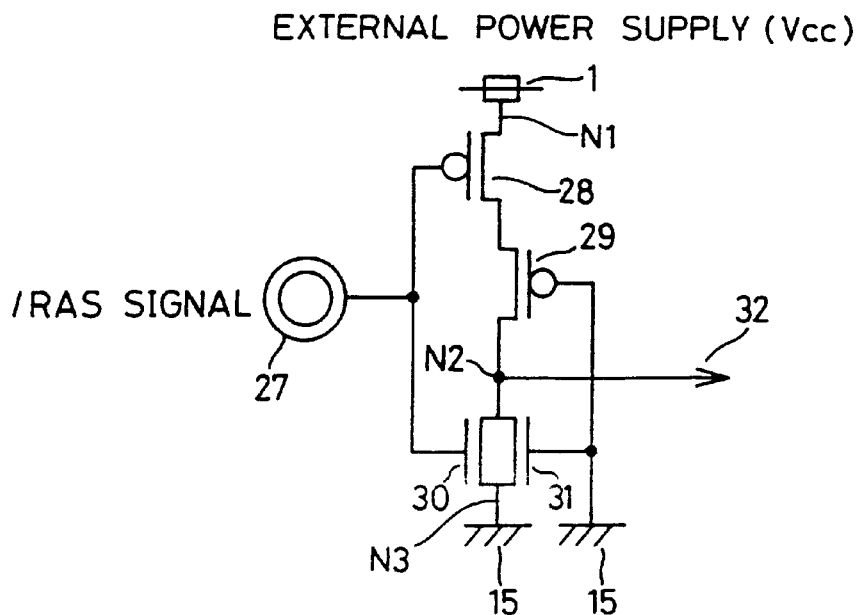
FIG. 4 is a circuit diagram showing in detail a first stage input buffer circuit to which a control signal is input in a DRAM in accordance with a second embodiment of the present invention.

FIG. 4 is a circuit diagram showing in detail one of first stage input buffer circuits to which control signals are respectively input in the DRAM in accordance with the second embodiment of the present invention. In FIG. 4, an $\overline{\text{RAS}}$ signal 27 is input thereto as a control signal. It is noted that a portion in FIG. 4 similar to that in FIG. 2 is denoted by the same reference and description thereof will not be repeated. That is, the first stage input buffer circuit of FIG. 4 has the same circuit structure as that of the first stage input buffer circuit of FIG. 2.

In short, first stage input buffer circuits 24 of the second embodiment use an external power supply 1 as a power supply thereof. An NOR gate structure is used as a circuit structure of each first stage input buffer circuit 24.

Figure 5:
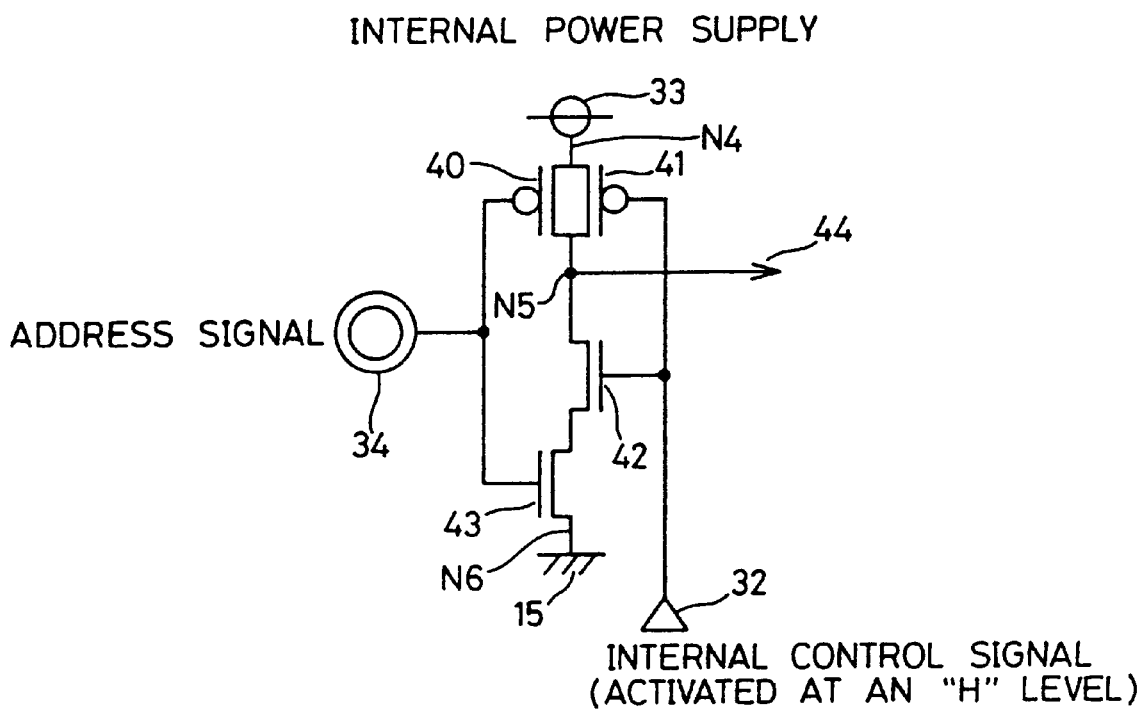
FIG. 5 is a circuit diagram showing in detail a first stage input buffer circuit to which a data input signal or an address signal is input in the DRAM in accordance with the second embodiment of the present invention.

FIG. 5 is a circuit diagram showing in detail one of first stage input buffer circuits 25 to which an address signal and a data input signal are respectively input in the DRAM in accordance with the second embodiment of the present invention. In FIG. 5, an address signal 34 is input thereto. It is noted that a portion of FIG. 5 similar to that of FIG. 3 is denoted by the same reference and description thereof will not be repeated.

Referring to FIG. 5, the first stage input buffer circuit to which an address signal is input includes P channel MOSFETs 40 and 41 and N channel MOSFETs 42 and 43.

P channel MOSFETs 40 and 41 are connected in parallel between an output node N5 and a node N4 having an internal power supply potential from an internal power supply 33. It is noted that an output signal 44 is output form output node N5. N channel MOSFETs 42 and 43 are connected in series between output node N5 and a node N6 having a ground potential from a ground 15. An address signal 34 is input to the gates of P channel MOSFET 40 and N channel MOSFET 43. An internal control signal 32 is input to the gates of P channel MOSFET 41 and N channel MOSFET 42.

An internal control signal 32 is at an "L" level during standby of the DRAM. Thus, P channel MOSFET 41 is on, and N channel MOSFET 42 is off. Therefore, the first stage input buffer circuit will always output an output signal 44 at an "H" level during standby. This means that the first stage input buffer circuit is deactivated by an internal control signal 32 at an "L" level. It is noted that an $\overline{\text{RAS}}$ signal is at an "H" level during standby of the DRAM.

When the DRAM is in an operative state, an internal control signal 32 at an "H" level is input to the gates of P channel MOSFET 41 and N channel MOSFET 42. Therefore, P channel MOSFET 41 is turned off, and N channel MOSFET 42 is turned on. At this time, if an address signal 34 at an "H" level is input, P channel MOSFET 40 is turned off and N channel MOSFET 43 is turned on. Thus, an output signal 44 at an "L" level will be output. On the other hand, if an address signal 34 at an "L" level is input, P channel MOSFET 40 is turned on and N channel MOSFET 43 is turned off. Thus, an output signal 44 at an "H" level will be output. It is noted that an $\overline{\text{RAS}}$ signal is at an "L" level when the DRAM is in an operative state.

An internal control signal 32 is produced based on a control signal such as an $\overline{\text{RAS}}$ signal.

Internal power supply 33 rather than an external power supply is used as a power supply of the first stage input buffer circuit to which an address signal or a data input signal is input. Voltage down-converting circuits 2 and 3 are used as internal power supply 33. Voltage down-converting circuits 2 and 3 down-convert an external power supply potential Vcc from external power supply 1 to generate an internal power supply potential. An internal power supply potential generated by voltage down-converting circuits 2 and 3 is stable regardless of variation in the external power supply potential Vcc.

First stage input buffer circuit 25 to which an address signal is input has an NAND gate structure which receives as inputs an address signal and an internal control signal 32.

The DRAMs in accordance with the first and the second embodiments are different from each other in structure of first stage input buffer circuits to which an address signal and a data input signal are respectively input. More specifically, the first stage input buffer circuits to which an address signal and a data input signal are respectively input in accordance with the first embodiment have an NOR gate structure, while the first stage input buffer circuits to which an address signal and a data input signal are respectively input in accordance with the second embodiment have an NAND gate structure. The first and the second embodiments are similar to each other in that a power supply potential is supplied from an external power supply to first stage input buffer circuits 24 to which an $\overline{RAS}$ signal and the like are respectively input and that a power supply potential is supplied from an internal power supply to first stage input buffer circuits 25 to which an address signal and the like are respectively input.

As described above, first stage input buffer circuits 24 and 25 of the DRAM in accordance with the second embodiment are characterized in that an NOR gate is not used regardless of a property of an external signal to be input thereto, but an NOR gate or an NAND gate is used depending on a property thereof. The reason why an NAND gate is used as first stage input buffer circuits 25 to which an address signal and a data input signal are respectively input will be described in detail in the following.

The DRAM is rendered in a standby state when a control signal such as an $\overline{RAS}$ signal is at an "H" level, and is rendered in an operative state in which a circuit provided in the subsequent stage is activated when the control signal is at an "L" level. Therefore, it is desirable to connect P channel MOSFETs 28 and 29 in series between external power supply 1 and output node N2 in first stage input buffer circuit 24 to which a control signal such as an $\overline{RAS}$ signal is input, as shown in FIG. 4.

In addition, since a threshold level for determining an "H" level or an "L" level is generally is smaller than half an external power supply potential Vcc supplied from external power supply 1, it is appropriate to form first stage input buffer circuit 24 to which control signals such as an $\overline{RAS}$ signal and the like are respectively input so as to have an NOR gate structure. This has been described in detail in the first embodiment.

On the other hand, signals such as an address signal and a data input signal respectively activate circuits provided in the subsequent stage by any one of two types of transitions, that is, transition from an "H" level to an "L" level and transition from an "L" level to an "H" level. Thus, the first stage input buffer circuits to which an address signal, a data input signal and the like are respectively input need not be NOR gates.

In general, an internal power supply potential of about 3.3 V resulting from down-conversion of an external power supply potential is often used in a 16M DRAM. In this case, a threshold level for determining an "H" level or an "L" level is 1.6 V if the TTL is used. Accordingly, when an internal power supply potential of 3.3 V is supplied from an internal power supply to first stage input buffer circuits, a threshold level (1.6 V) is about half an internal potential. Thus, considering that an N channel MOSFET has ability superior to that of the P channel MOSFET if the P channel MOSFET and the N channel MOSFET have the same size, it is desirable to form first stage input buffer circuits to which an address signal and a data input signal are input so as to have an NAND gate structure rather than an NOR gate structure. More detailed description will be given in the following using FIGS. 3 and 5.

It is assumed that an internal power supply potential from an internal power supply 33 is 3.3 V and a threshold level for determining an "H" level or an "L" level is 1.6 V. A gate length of a P channel MOSFET and an N channel MOSFET is represented by L, and a gate width (channel width) thereof by W. In this case, resistance is proportional to a value of L/W. In addition, as described in the first embodiment, an N channel MOSFET has ability twice that of a P channel MOSFET if respective values of L/W of the N channel MOSFET and the P channel MOSFET are the same.

Referring to FIG. 3, resistance of combination of P channel MOSFET 35 and P channel MOSFET 36 is proportional to a value of 2L/W. Resistance of combination of N channel MOSFET 37 and N channel MOSFET 38 is proportional to a value of L/W. In addition, as described above, the ability of an N channel MOSFET is said to be about twice the ability of a P channel MOSFET. It is assumed that an internal control signal 32b at an "L" level is input to the gate of N channel MOSFET 38.

Accordingly, if a threshold level for determining an "H" level or an "L" level is set to 1.6 V which is about half an internal power supply potential of 3.3 V, the respective gate widths Ws of P channel MOSFETs 35 and 36 are required to be four times what they are. Thus, if first stage input buffer circuit 25 to which an address signal or a data input signal is input is formed to have an NOR gate structure, size of a P channel MOSFET is increased, so that a circuit scale of the first stage input buffer circuit is also increased.

Referring to FIG. 5, resistance of combination of P channel MOSFET 40 and P channel MOSFET 41 is proportional to a value of L/W. Resistance of combination of N channel MOSFET 43 and N channel MOSFET 42 is proportional to a value of 2L/W. Accordingly, if a threshold level for determining an "H" level or an "L" level is set to 1.6 V which is about half an internal power supply potential (3.3 V) from internal power supply 33, all of P channel MOSFETs 40 and 41 and N channel MOSFET 42 and 43 may have the same size. In this case, it has been considered that the ability of an N channel MOSFET is about twice the ability of a P channel MOSFET.

Consequently, if a threshold level for determining an "H" level or an "L" level is set to a value about half an internal power supply potential, a first stage input buffer circuit having an NAND gate structure as shown in FIG. 5 has a smaller circuit scale than that having an NOR gate structure. Furthermore, if a threshold level for determining an "H" level or an "L" level is to be set to a value about half an internal potential in the case of the circuit structure of FIG. 3 without increase in size of P channel MOSFETs 35 and 36, size of N channel MOSFETs 37 and 38 is required to be reduced. In this case, an operation speed of a first stage input buffer circuit is reduced. Accordingly, higher operation speed can be achieved in the first stage input buffer circuit of FIG. 5 without increase in a circuit scale thereof.

FIG. 5 shows a first stage input buffer circuit for an address signal. However, the first stage input buffer circuit of FIG. 5 can be used for a signal such as a data input signal which may activate a circuit provided in the subsequent stage by any one of transitions from an "H" level to an "L" level and from an "L" level to an "H" level. In this case as well, effects similar to those in the case of the first stage input buffer circuit of FIG. 5 can be obtained.

It is noted that first stage input buffer circuit 24 for an external signal which activates a circuit provided in the subsequent stage only by transition from an "H" level to and "L" level has a logic circuit structure of an NOR gate. However, a circuit similar to an NOR gate, such as a circuit in which a switching element is added to an inverter circuit can be used instead of an NOR gate as this first stage input buffer circuit.

Furthermore, first stage input buffer circuit 25 for an external signal which can activate a circuit provided in the subsequent stage by any one of transitions from an "L" level to an "H" level and from an "H" level to an "L" level has a logic circuit structure of an NAND gate. However, a circuit similar to an NAND gate, such as a circuit in which a switching element is added to an inverter circuit can be used instead of an NAND gate as this first stage input buffer circuit.

An external signal which activates a circuit provided in the subsequent stage only by transition from an "H" level to an "L" level out of external signals to be input to the first stage input buffer circuits is herein referred to as an external signal having a first property. In addition, an external signal which activates a circuit provided in the subsequent stage by any one of transitions from an "L" level to an "H" level and from an "H" level to an "L" level out of external signals to be input to the first stage input buffer circuits is called an external signal having a second property.

In such a case, all of a plurality of first stage input buffer circuits to which a plurality of external signals having a first property are respectively input are formed to have the same logic circuit structure. Thus, the plurality of first stage input buffer circuits for a plurality of external signals having a first property can be made to have the same logic threshold and the same operation speed.

Furthermore, a plurality of first stage input buffer circuits to which a plurality of external signals having a second property are respectively input are formed to have the same logic circuit structure. Thus, the plurality of first stage input buffer circuits for a plurality of external signals having a second property can be made to have the same logical threshold and the same operation speed.

As described above, all the first stage input buffer circuits to which external signals having the same property are respectively input can be made to have the same logical threshold and the same operation speed by forming the first stage input buffer circuits so as to have the same logic circuit structure, resulting in stable operation of the entire DRAM.

An external signal having a first property is, for example, a control signal for controlling internal operation of the DRAM. An external signal having a second property is, for example, a data input signal or an address signal.

Furthermore, all of a plurality of first stage input buffer circuits to which a plurality of external signals having the same property are respectively input can be made to have the same logic circuit structure in the case of the first embodiment as well. Effects similar to those described above can be also obtained in this case.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a first stage input circuit of a first type to which a first group of external signals originating from outside said semiconductor device is input;
    a first stage input circuit of a second type, different from said first type, to which a second group of external signals originating from outside said semiconductor device are input;
    an external power supply terminal for supplying an external power supply potential; and
    a generator for generating an internal power supply potential;
    wherein: said first group of external signal are different signals from said second group of external signals
        said first type first stage input circuit is driven by said external power supply potential supplied from said external power supply terminal, and
        said second type first stage input circuit is driven by said internal power supply potential supplied from said generator.

2. The semiconductor device according to claim 1, wherein:
    an output level of said type first stage input circuit is fixed when said semiconductor device is in a standby state, and
    said first group of external signals have different properties from said second group of external signals.

3. The semiconductor device according to claim 1, wherein said first group of external signals are control signals for controlling internal operation of said semiconductor device.

4. The semiconductor device according to claim 3, wherein
    said control signals are signals which are rendered active by only one transition out of transitions from a high level to a low level and from a low level to a high level.

5. The semiconductor device according to claim 3, wherein
    said first type first stage input circuit has an NOR gate structure.

6. The semiconductor device according to claim 1, wherein said second group of external signals are address signals or data input signals.

7. The semiconductor device according to claim 6, wherein
    said second type first stage input circuit has an NOR gate structure.

8. The semiconductor device according to claim 6, wherein
    said second type first stage input circuit has an NAND gate structure.

9. The semiconductor device according to claim 1, wherein:
    said first group of external signals are control signals for controlling internal operation of said semiconductor device,
    said second group of external signals are address signals or data input signals, and
    an output level of said second type first stage input circuit is fixed according to an internal control signal which is based on said control signals, when said semiconductor device is in a standby state.

10. The semiconductor device according to claim 9, wherein
    each of said first and said second type first stage input circuits has an NOR gate structure.

11. The semiconductor device according to claim 9, wherein
    said first type first stage input circuit has an NOR gate structure, and said second type first stage input circuit has an NAND gate structure.

12. The semiconductor device according to claim 1, further comprising a first stage input unit including a plurality of said first type first stage input circuits, said plurality of first type first stage input circuits being constituted by logic circuits which are identical to each other.

13. The semiconductor device according to claim 1, further comprising a first state input unit including a plurality of said second type first state input circuits, said plurality of second type first stage input circuit being constituted by logic circuits which are identical to each other.

14. A semiconductor device, comprising:

a first stage input unit to which a plurality of external signals originating from outside said semiconductor device are input, wherein:

said first stage input unit includes at least two first stage input circuits of a first type and second type which are different from each other, said first type first stage input circuit being formed by a NOR gate driven by an external power supply, and said second type first stage input circuit being formed by a NAND gate driven by an internal power supply, and an external signal is applied to either one of said first type and second type first stage input circuits.

* * * * *